United States Patent [19]
Kinoshita

[11] Patent Number: 5,883,914
[45] Date of Patent: Mar. 16, 1999

[54] INTEGRATED DEVICE WITH MONOLITHICALLY FORMED LIGHT EMITTING ELEMENT AND EXTERNAL MODULATOR AND INTEGRATED DEVICE WITH MONOLITHICALLY FORMED LIGHT EMITTING ELEMENT AND LIGHT RECEIVING ELEMENT

[75] Inventor: Junichi Kinoshita, Yokohama, Japan

[73] Assignee: Kabushiki Kaisha Toshiba, Kawasaki, Japan

[21] Appl. No.: 692,179

[22] Filed: Aug. 5, 1996

[30] Foreign Application Priority Data

Aug. 28, 1995 [JP] Japan .................................. 7-219010

[51] Int. Cl.$^6$ ............................... H01S 3/10; H01S 3/19
[52] U.S. Cl. ............................. 372/50; 372/26; 372/96; 372/102
[58] Field of Search ................... 372/50, 26, 96, 372/102

[56] References Cited

U.S. PATENT DOCUMENTS

| | | | |
|---|---|---|---|
| 4,958,357 | 9/1990 | Kinoshita | 372/96 |
| 5,056,098 | 10/1991 | Anthony et al. | 372/45 |
| 5,073,041 | 12/1991 | Rastani | 385/33 |
| 5,170,402 | 12/1992 | Ogita et al. | 372/50 |
| 5,408,486 | 4/1995 | Shoji | 372/26 |
| 5,548,607 | 8/1996 | Tsang | 372/26 |

FOREIGN PATENT DOCUMENTS

| | | |
|---|---|---|
| 0 499 659 A1 | 8/1992 | European Pat. Off. . |
| 0 618 651 A2 | 10/1994 | European Pat. Off. . |

OTHER PUBLICATIONS

Patent Abstracts of Japan, Kokai No. 6–21581, vol. 18, No. 230, Apr. 26, 1994.

Scherer, et al., "Fabrication of Microlasers and Microresonato Optical Switches", Applied Physics Letters, vol. 55, No. 26, Dec. 25, 1996, pp. 2724–2726.

*Primary Examiner*—James W. Davie
*Attorney, Agent, or Firm*—Finnegan, Henderson, Farabow, Garrett & Dunner, L.L.P.

[57] ABSTRACT

A GCL is formed on a first major surface of a semi-insulating InP substrate. Specifically, an InGaAsP active layer, an InGaAsP waveguide path and a striped grating having two phase shift portions are formed on the first major surface of the InP substrate. An EA modulator is formed on a second major surface of the semi-insulating InP substrate. Specifically, a p-InP layer, an MQW structure of 100-layer, an $n^-$-InP layer and an $n^+$-InP layer are formed on the second major surface of the InP substrate. The first major surface and second major surface of the InP substrate are inclined to each other by a few degrees.

22 Claims, 11 Drawing Sheets

INTEGRATED DEVICE WITH MONOLITHICALLY FORMED LIGHT EMITTING ELEMENT AND EXTERNAL MODULATOR AND INTEGRATED DEVICE WITH MONOLITHICALLY FORMED LIGHT EMITTING ELEMENT AND LIGHT RECEIVING ELEMENT

BACKGROUND OF THE INVENTION

1. Field of the Invention

The present invention relates to an integrated device in which a light emitting element and an external modulator (or an element functioning as light receiving element) are monolithically formed, and an integrated device in which a light emitting element and a light receiving element are monolithically formed.

2. Description of the Related Art

By virtue of development of optical fibers, optical communication technology has widely been applied to technical fields of high-speed, long-distance and large-capacity telecom systems, middle-distance telecom systems and short-distance data communication systems. Light emitting elements, light receiving elements and modulators for data transmission are key components for optical communication technology in these fields.

In the prior art, however, a light emitting element, a light receiving element and a modulator are generally manufactured independently as discrete semiconductor elements. Accordingly, the cost for manufacturing one optical system becomes enormous since time and labor is needed for the assembly and wiring of each semiconductor element.

For example, consideration will now be given of the case of using a semiconductor laser (e.g. laser diode) including a modulation function as a light emitting element.

When such a direct-modulation type semiconductor laser element is used, a transmitter unit needs to comprise an optical connector for coupling a laser beam output from the semiconductor laser to an optical fiber, a monitoring light receiving element (e.g. PIN photodiode) for stabilizing laser intensity, and an arrangement for coupling a laser beam from the opposite side of the semiconductor laser to the monitoring light receiving element.

A receiver unit is also needed in addition to the transmitter unit. In the prior art, however, the transmitter unit and receiver unit cannot share a single optical fiber, for the following reasons.

a) The receiver unit generally includes a PIN photodiode (light receiving element). Since the PIN photodiode is formed on the major surface of a semiconductor substrate, a light signal must be made incident on the major surface of the semiconductor substrate perpendicularly. By contrast, in the case of a laser diode (light emitting element), a light signal is generally emitted from a surface perpendicular to the major surface of a semiconductor substrate, i.e. a cleaved surface formed by cleaving the semiconductor substrate.

b) The PIN photodiode is a device rendered operative by application of an electric field, whereas the laser diode is a device rendered operative by injection of current. It is difficult, therefore, to use a common drive circuit both for driving the PIN photodiode and for modulating the laser diode.

Recently, a surface emitting type laser has been proposed, wherein a cavity is formed perpendicular to the surface of a semiconductor substrate and a laser beam is emitted from the surface of the semiconductor substrate. In the surface emitting laser, however, an electric current is injected at high density in an active layer of a small volume and the laser tends to generate heat, resulting in low output power. Thus, this laser has not yet been put to practical use.

On the other hand, a DFB (Distribution Feedback) laser is used as a light emitting element in a transmitter for high-speed, long-distance systems. The DFB laser oscillates in a single longitudinal mode, unlike an FP (Fabry-Perot) laser oscillating in a multi-longitudinal mode.

The DFB laser has a grating formed along the cavity direction. The grating has a predetermined period which determines the wavelength of the single longitudinal mode.

A DBR (Distributed Bragg Reflector) laser, like the DFB laser, is a device making use of a grating. The principle of oscillation in the single longitudinal mode of the DBR laser is similar to that of oscillation in the single longitudinal mode of the DFB laser.

Thus, in the DBR laser, too, the waveform of a signal, which has passed through an optical fiber with a wavelength distribution, does not change, and the signal can be transmitted over a long distance.

However, the modulation bandwidth of an optical output from the directly modulated DFB laser is limited by an interaction between carriers produced by current and photons generated by carries and is close to the bandwidth limit. In addition, even if the DFB laser is operated at a narrow single spectral line, complex dynamic characteristics and instability may lead to a problem of broadening the oscillation linewidth (wavelength chirp).

Accordingly, the direct-modulation type DFB laser is not suitable for much longer distance signal transmission.

In order to overcome the above problems, attention has been paid to systems using an external modulator. In this method, a laser diode is driven by a DC current. The modulation is not performed in the laser diode, and output light of the laser diode is modulated by the external modulator.

The external modulator may be of Mach-Zender type, EA type (Electro-Absorption type), etc. Recently, EA type external modulators are predominant, which permit monolithic integration of laser diodes with the external modulators.

Some specific conventional devices will now be described with reference to prior-art documents.

Figure 1:
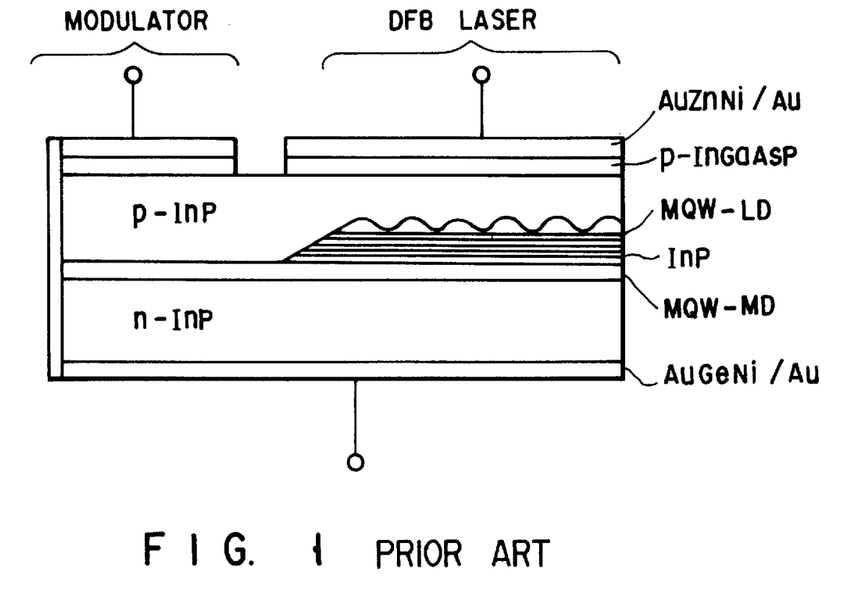
FIG. 1 shows a conventional integrated device.

FIG. 1 shows a device disclosed in Document 1 (K. Wakita, et al., IEEE Photonics Technology Letter, vol. 5, No. 8, p. 899, 1993).

In this device, a DFB laser and an EA modulator are integrated monolithically. The DFB laser and EA modulator are connected coaxially and a laser beam from the DFB laser is emitted in parallel to the surface of the substrate via the modulator.

Figure 2:
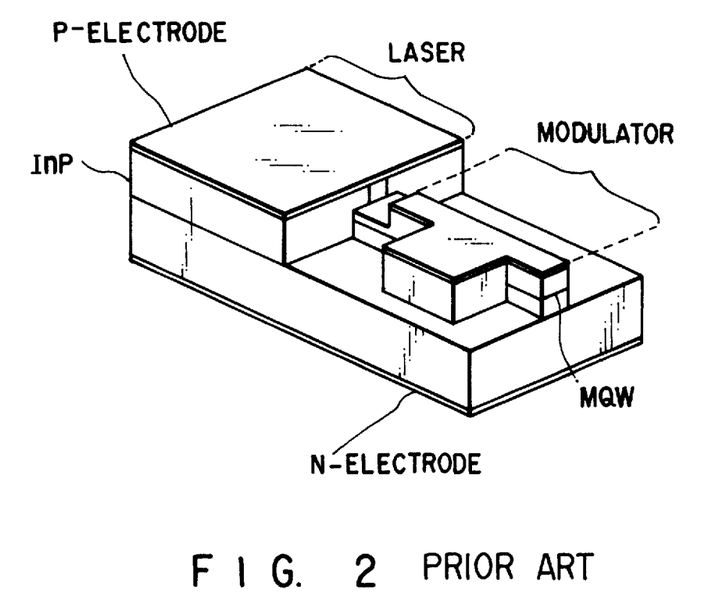
FIG. 2 shows a conventional integrated device.
Figure 3A:
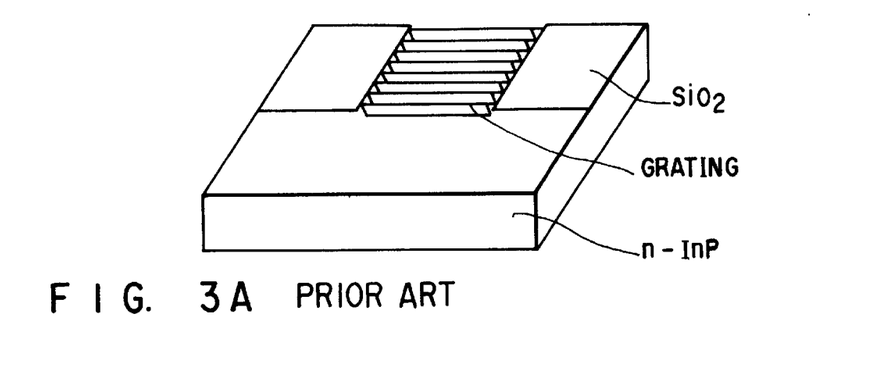
FIGS. 3A to 3E show a conventional integrated device.
Figures 3B, 3C, 3D:
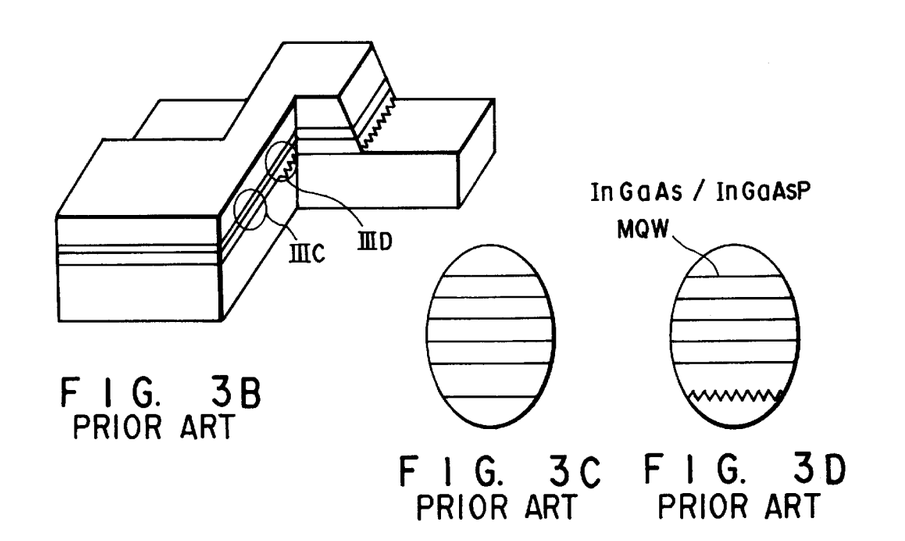
Figure 3E:
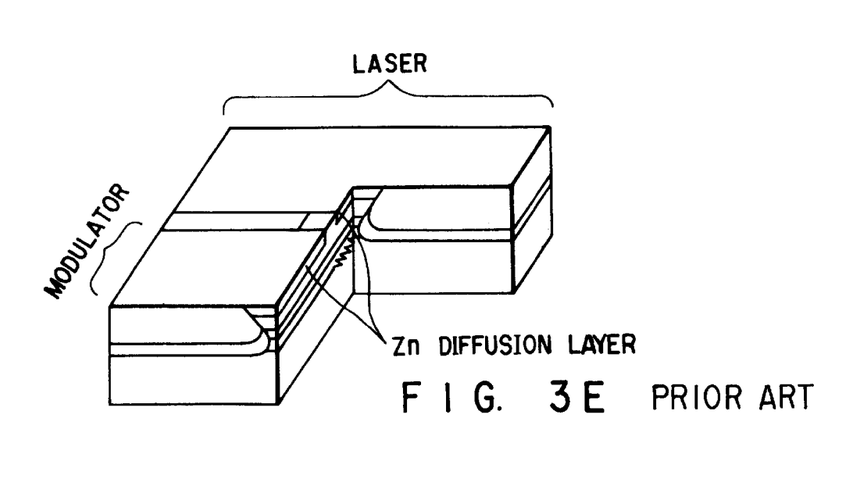

FIG. 2 shows a device disclosed in Document 2 (I. Kotani, et al., IEEE Photonics Technology Letter, vol. 5, No. 1, p. 62, 1993).

In this device, too, a DFB laser and an EA modulator are integrated monolithically. Like the device shown in FIG. 1, the DFB laser and EA modulator are connected coaxially and a laser beam from the DFB laser is emitted in parallel to the surface of the semiconductor substrate via the modulator.

FIGS. 3A to 3E show a device disclosed in Document 3 (M. Aoki, et al., Electronics Letters, vol. 27, No. 23, p. 621, 2138, 1991).

In this device, too, a DFB laser and an EA modulator are integrated monolithically. Like the device shown in FIG. 1, the DFB laser and EA modulator are connected coaxially and a laser beam from the DFB laser is emitted in parallel to the surface of the semiconductor substrate via the modulator.

Figure 4:
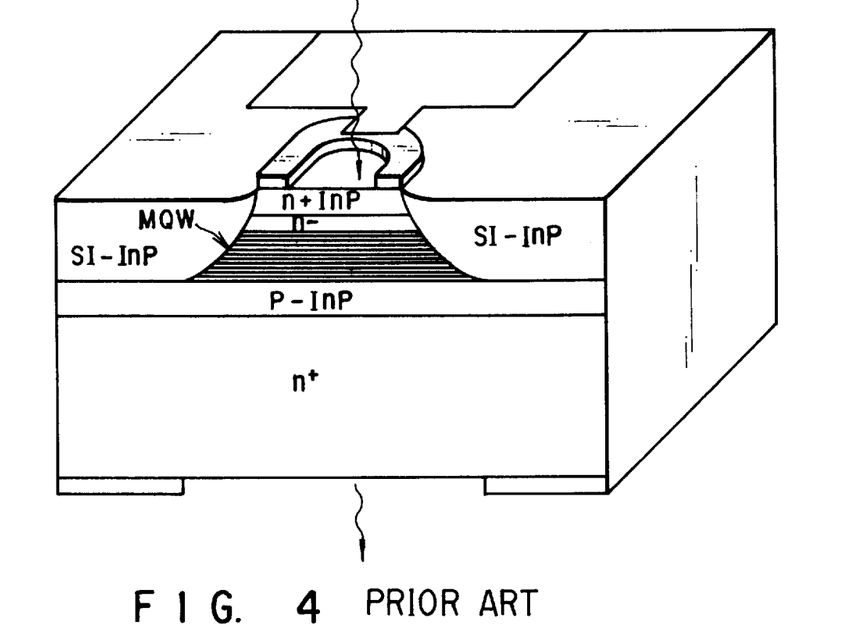
FIG. 4 shows a conventional EA modulator.

FIG. 4 shows a device disclosed in Document 4 (U. Koren, et al., Electronics Letters, vol. 23, No. 12, p. 621, 1987).

This device is a discrete semiconductor device in which an EA modulator is formed monolithically.

The devices of Documents 1 to 3 are characterized in that the DFB laser and EA modulator are integrated coaxially in the direction of the waveguide.

The DFB laser having an active layer of an MQW (Multi-Quantum Well) structure has a driving electrode, to which a DC current is supplied to emit an output beam. The output beam is guided as a waveguide-mode beam to a waveguide in a modulation region. In the modulation region, only a layer necessary for guiding waves is formed, and an active layer and a grating are not provided.

If a reverse bias voltage is applied to the modulation region, a field effect, e.g. Stark effect or Franz-Keldysh effect, occurs, and an absorption band of the waveguide is shifted to the longer wavelength side. As a result, the output light of the modulator is greatly attenuated, which implies the modulation by applying voltage. In addition, a very high speed operation higher than 10 Gbps is theoretically enabled, with extremely small chirp.

However, in order to achieve the above ideal condition, electrical isolation must be maintained between the laser diode and external modulator. Furthermore, the optical return from the first and/or the modulator to the laser must be minimized to avoid the occurrence of chirp and instability of the laser.

The electrical isolation can be effected by increasing a physical distance between the laser diode and the external modulator. If the physical distance between the laser diode and external modulator is increased, the area of the chip would increase, and the optical coupling between the two devices becomes small.

To minimize the optical return to the laser is very difficult. In general, in DFB lasers and DBR lasers, the phase of light traveling reciprocally within the resonator varies due to residual reflection. Consequently, the oscillation wavelength of the laser and the intensity of output would fluctuate and in a worst case, the oscillation becomes unstable.

In conventional devices, in general, a laser beam is emitted from the laser diode in parallel to the surface of the semiconductor substrate. Specifically, when a laser diode and an external modulator are monolithically integrated, the laser diode and external modulator are connected coaxially.

This being the case, it is difficult to use planar techniques in the process of manufacturing such devices, and the manufacture thereof is difficult.

SUMMARY OF THE INVENTION

The present invention has been made to overcome the above-mentioned drawbacks occurring when a light emitting element and an external modulator are monolithically integrated. An object of the invention is to provide an integrated device which is of a surface light emission type, requires no cleaving, permits use of an external modulator as a light receiving element, permits easy integration of the light emitting element and external modulator, achieves stable operation, and remarkably reduces chirp Another object of the invention is to provide an integrated device having a monolithically integrated structure of a light emitting element and a light receiving element, which device is of a surface light emission type, requires no cleaving, permits easy integration of the light emitting element and light receiving element, achieves stable operation, and remarkably reduces chirp.

Still another object of the invention is to apply an integrated device of the light emitting element and external modulator or an integrated device of the light emitting element and the light receiving element as a high-speed array device for data communication.

In order to achieve the above objects, there is provided an integrated device comprising:

a semiconductor substrate;

a light emitting element of a surface emission type, provided on a first major surface of the semi-conductor substrate, the light emitting element radiating light towards the semiconductor substrate; and an external modulator formed on a second major surface of the semiconductor substrate and situated in a region opposed to the light emitting element.

The light emitting element may be one of a DFB laser and a DBR laser, each of which has a grating along a waveguide. The grating may have phase shift regions and the shift amount in the phase shift regions may be ⅜ of the wavelength of the light.

The light emitting element may have a waveguide and both end portions of the waveguide may be provided with reflection-free structures such as anti-reflection coatings. The external modulator may comprise an element having absorption properties variable due to application of an electric field.

The external modulator may function also as a light receiving element for monitoring an optical signal output from the light emitting element. The external modulator may function also as a light receiving element for receiving and detecting an optical signal input from the outside.

The integrated device according to this invention may further comprise a layer, formed on the second major surface of the semiconductor substrate, for shutting out light output from the light emitting element to a region other than a region where the external modulator is situated. The output from a region faced on the external modulator is situated may be highest.

The integrated device according to this invention may further comprise a lens for decreasing a divergence of the light output from the light emitting element, the lens being situated between the light emitting element and the external modulator.

The second major surface of the semiconductor substrate may be inclined to the first major surface of the semiconductor substrate by a predetermined angle. The semiconductor substrate may be semi-insulating, and the light emitting element and the external modulator may be electrically isolated from each other.

The semiconductor substrate may pass the light output from the light emitting element and guide the light to the external modulator. The semiconductor substrate may be InP.

The light emitting element may radiate light in directions toward and away from the semiconductor substrate, and the light radiated in the direction away from the semiconductor substrate may be reflected by a reflection mirror and reflected towards the semiconductor substrate.

The light emitting element may include an active layer having one of an MQW (Multi-Quantum Well) structure and a strained MQW structure.

The external modulator may have an MQW (Multi-Quantum Well) structure.

The integrated device according to this invention may further comprise a printed circuit board coupled to the light emitting element and bonding wires for connecting the external modulator and wiring on the printed circuit board.

There is also provided an integrated device comprising:

a semiconductor substrate;

a plurality of surface emission type light emitting elements, provided on a first major surface of the semiconductor substrate, the light emitting elements radiating light towards the semiconductor substrate; and a plurality of external modulators formed on a second major surface of the semiconductor substrate and situated in regions opposed to the light emitting elements.

Each of the light emitting elements may be one of a DFB laser and a DBR laser each having a grating along a waveguide. The grating may have phase shift regions and the shift amount in the phase shift regions may be $\frac{3}{8}$ of the wavelength of the light.

The light emitting element may have a waveguide, and both end portions of the waveguide may be provided with reflection-free structures such as anti-reflection coatings. Each of the external modulators may comprise an element having absorption properties variable due to application of an electric field.

One of the external modulators may function also as a light receiving element for monitoring an optical signal output from the light emitting element. Each of the external modulators may function also as a light receiving element for receiving and detecting an optical signal input from the outside.

The integrated device according this invention may further comprise a layer, formed on the second major surface of the semiconductor substrate, for shutting out light output from the light emitting elements to a region other than region where the external modulators are situated.

The second major surface of the semiconductor substrate may be inclined to the first major surface of the semiconductor substrate by a predetermined angle. The semiconductor substrate may be semi-insulating, and the light emitting elements and the external modulators may be electrically isolated from each other.

The semiconductor substrate may pass the light output from the light emitting elements and guide the light to the external modulators. The semiconductor substrate may be InP.

Each of the light emitting elements may include an active layer having one of an MQW (Multi-Quantum Well) structure and a strained MQW structure. The external modulator may have an MQW (Multi-Quantum Well) structure.

There is also provided an integrated device comprising:

a light emitting element having a radiation mode in which light is emitted from all over the grating;

an external modulator situated on a light emission side of the light emitting element at a region where the light has a highest intensity; and a layer, provided between the light emitting element and the external modulator, for electrically isolating the light emitting element and the external modulator and passing the light output from the light emitting element.

There is also provided an integrated device comprising:

a light emitting element including a waveguide and having a guided mode in which light is emitted from end portions of the waveguide path;

an external modulator for controlling cut/transmission (ON/OFF) of the light;

a reflection mirror for guiding the light from the light emitting element to the external modulator and a layer, provided between the light emitting element and the external modulator, for electrically isolating the light emitting element and the external modulator and passing the light output from the light emitting element.

There is also provided an integrated device comprising:

a semiconductor substrate;

a light emitting element of a surface emission type, provided on a first major surface of the semiconductor substrate, the light emitting element radiating light in directions towards and away from the semiconductor substrate; and a reflection mirror, provided on a second major surface of the semiconductor substrate, for reflecting the light radiated towards the semiconductor substrate.

There is also provided an integrated device comprising:

a semiconductor substrate;

a light emitting element of a surface emission type, provided on a first major surface of the semiconductor substrate, the light emitting element radiating light in directions towards and away from the semiconductor substrate; and a light receiving element provided on a second major surface of the semiconductor substrate and situated in a region faced to the light emitting element.

The light emitting element may be one of a DFB laser and a DBR laser, each of which has a grating along a waveguide. The grating may have a phase shift region and the shift amount in the phase shift region is $\frac{3}{8}$ of the wavelength of the guided wave.

The light receiving element may be a PIN photodiode. The light receiving element may have an active layer, an opening portion being formed in a part of the active layer, the light emitting element being formed in a position corresponding to the opening portion. The intensity of light may be highest in a region where the light receiving element is situated.

The semiconductor substrate may contain impurities, and the light emitting element and the light receiving element may be electrically connected to each other.

The semiconductor substrate may pass the light output from the light emitting element and couple the light to the light receiving element. The semiconductor substrate may be InP. The light emitting element may include an active layer having one of an MQW (Multi-Quantum Well) structure and a strained MQW structure.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Integrated devices according to preferred embodiments of the present invention will now be described with reference to the accompanying drawings.

In the present invention, a light emitting element comprises a surface emitting type element of which output beam is emitted in a direction perpendicular to the surface of a semiconductor substrate. In the present invention, it is supposed that the light emitting device is mainly used as a backlight, as in a TFT-LCD (Thin Film Transistor-Liquid Crystal Display). In addition, the present invention is directed to DFB lasers and DBR lasers of a grating-coupled (GC) type.

The grating-coupled laser (GCL) has an output beam not in a guided mode but in a radiation mode. Thus, the beam divergence along the cavity direction is as small as several degrees. If the angle of a reflected beam is slightly displaced, the reflected beam does not return and couple back to the waveguide structure.

In the case of short-distance communication, a surface emitting type LED can be used as a backlight. However, since the output light of the surface emitting type LED has a large spectral band width, the dynamic range of wavelength of a modulator needs to be increased, which is not so practical actually.

The EA modulator is not of a waveguide type but of a surface type, and it is a field effect type device driven by a reverse bias. A PIN photodiode as light receiving element also utilizes an electric field effect. For this reason, the surface-type EA modulator can be operated as PIN photodiode. In this case, a modulator as a transmitter and PIN photodiode as a receiver can be formed of devices of the same structure.

As a result, bidirectional communication can be performed with use of only one optical fiber without any distribution branches into both transmitter and receiver. It is also possible to constitute drive circuits of the transmitter and the receiver as a common voltage supply. Since the surface-type device can be easily integrated, planar techniques are applicable.

Complete electrical and optical isolation can be obtained if the light emitting element and EA modulator, or the light emitting element and light receiving element, are monolithically formed, with one of the paired elements provided on one surface of a semi-insulating substrate and the other element provided on the other surface of the semi-insulating substrate. In addition, in this case, the manufacturing process is facilitated by making use of planar techniques.

Furthermore, light input and output surfaces can be processed to have lens-shapes, and therefore the performance can be enhanced.

As has been described above, the present invention is not a simple combination of prior-art techniques but can bring about a remarkable effect.

The GCL (Grating-Coupled Laser) will now be described.

Figure 17:
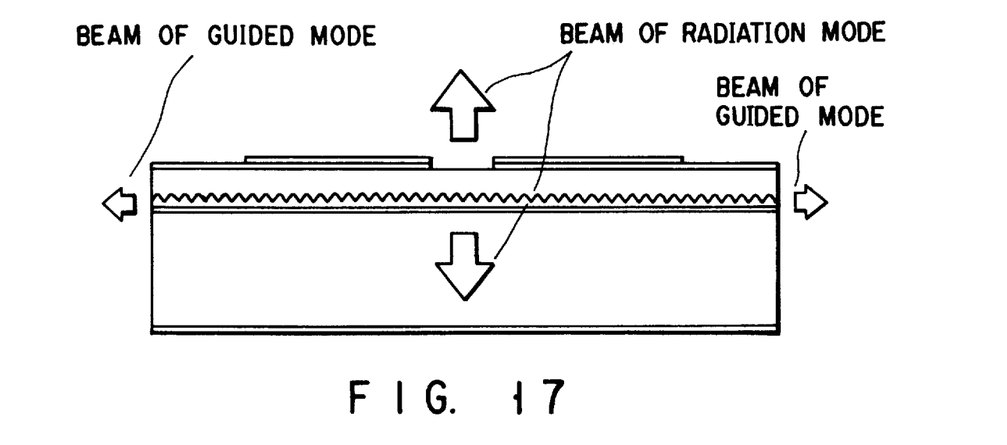
FIG. 17 shows a GCL.

FIG. 17 shows a GCL. The GCL, i.e. a surface emitting type DFB laser using a grating of a second-order or a higher order, has a guided mode in which a laser beam is emitted from end faces parallel to the major surface of a semiconductor substrate, and a radiation mode in which a laser beam is emitted from the grating. Specifically, if the grating is of the second-order, light is emitted in a direction perpendicular to the length direction of the cavity.

The radiation mode is emitted vertically to the grating, i.e. the upward and downward directions. Accordingly, one of the vertically emitted beams can be used as an optical output signal. The other beam may be absorbed for nonuse, or reflected for coherence to intensify the output signal, or used for monitoring the output signal.

The light beam in the radiation mode is emitted from the waveguide. Accordingly, the output signal may be intensified or weakened by making use of optical coherence in the radiation mode. In addition, the optical output may be provided with a distribution in the direction of the cavity and the external modulator may be situated at a position where the optical output is maximum.

One means for achieving the above-described principle is a structure ($3\lambda/8$ phase shift) wherein the phase of light is shifted by $3/8$ of guided wavelength at two locations near the center of the GCL. Specifically, constructive interference of light in the radiation mode occurs at these two locations.

This structure is described in Document 5 (Japanese Patent Application No. 63-317818 corresponding to U.S. Pat. No. 4,958,357, European Patent Application No. 88312036.2, Korean Patent No. 058391, and J. Kinoshita, p. 407, IEEE Journal of Quantum Electronics, vol. QE-26, No. 3, 1990).

Figure 5A:
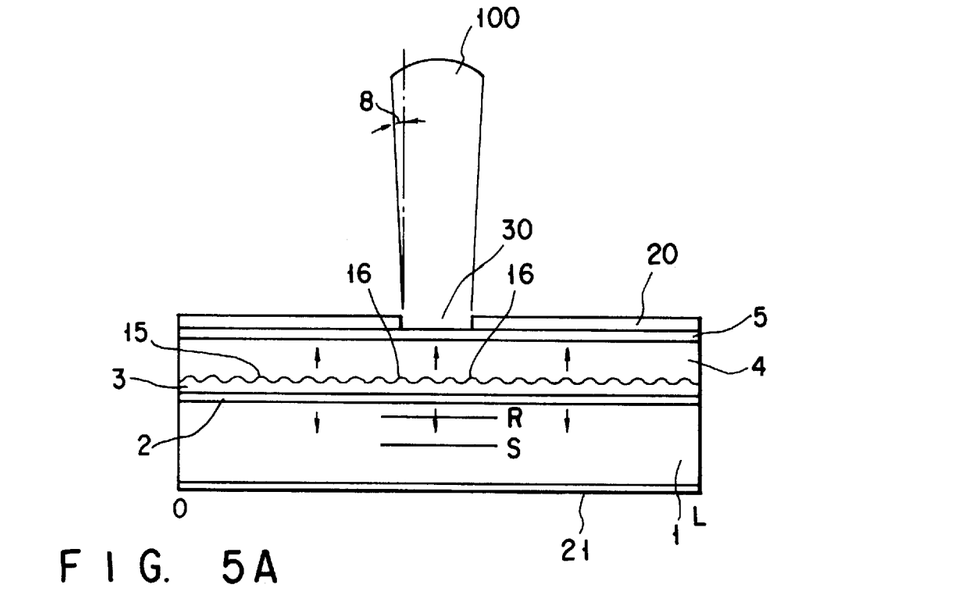
FIGS. 5A and 5B show a conventional GCL (Grating-Coupled Laser)
Figure 5B:
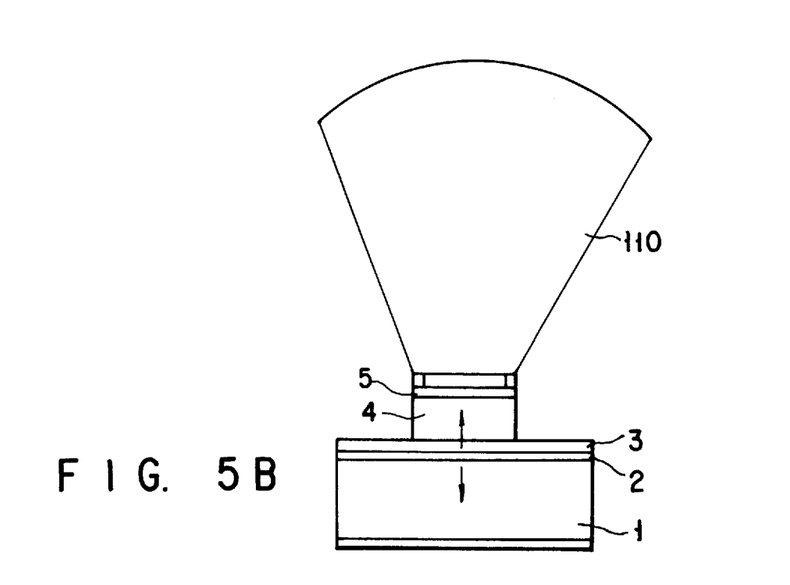
Figure 5C:
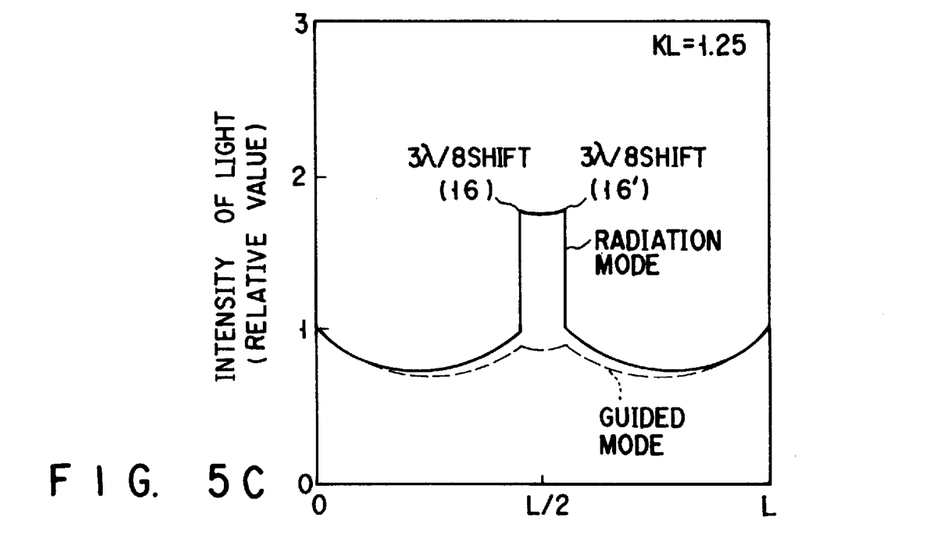
FIG. 5C shows a light intensity distribution profile.

FIGS. 5A and 5B shows a device disclosed in Document 5. FIG. 5A is a cross-sectional view, taken in a longitudinal direction of a resonator, showing an InGaAsP/InP type DFB laser with $3\lambda/8$ phase shift. FIG. 5B shows the InGaAsP/InP type DFB laser with $3\lambda/8$ phase shift, as viewed from the end face side of the resonator. FIG. 5C shows a light intensity distribution profile along the cavity.

An InGaAsP active layer 2 and an InGaAsP waveguide layer 3 having a wider band gap than the InGaAsP layer 2 are formed on an n-type InP layer 1. A second-order grating 15 is formed on the InGaAsP waveguide layer 3. The grating 15 is provided with two $3\lambda/8$ phase-shift portions 16 and 16' between which a central portion of the resonator is located.

A p-Inp layer 4 and a p-IGaAsP ohmic-contact layer 5 are formed on the grating 15. The p-InP layer 4 and contact layer 5 are mesa-etched in stripes so as to have a ridge-type waveguide structure. An electrode 20 is put in contact with the p-InGaAsP ohmic-contact layer 5, and an electrode 21 is put in contact with the n-type InP layer 1. An output window 30 is formed in the electrode 20 in a position corresponding a region between the 3λ/8 phase-shift portions 16 and 16'.

Components of two traveling waves R and S, which reciprocally propagate in the waveguide, are radiated by the second-order grating 10 in a direction vertical to the substrate as a beam 100 with very narrow beam divergence peculiar to the radiation mode, i.e., as narrow as a few degree.

The light components radiated downward are not considered, supposing that they are scattered on the bottom surface of the substrate. In this case, as shown in FIG. 5C, two radiation-mode beams are intensified between the 3λ/8 phase-shift portions 16 and 16' (as indicated by a solid line). However, if the λ/8 phase-shift portion is used, the optical output is greatly reduced. The beam divergence of radiation mode 110 in the direction perpendicular to the waveguide is about 30° of full width at half maximum.

The senior patent application (Document 5) by the inventor proposes modulation of output by varying a phase shift amount. In this case, however, the wavelength varies if the shift amount varies. Thus, this technique is disadvantageous in decreasing chirp. In addition, since modulation is effected by electric current, the modulating unit and light emitting unit are not completely separated and a mutual effect or crosstalk may occur between the modulating unit and light emitting unit.

In the following embodiments, the optical output is modulated not by varying the phase-shift amount, but by means of an external modulator.

Figure 6:
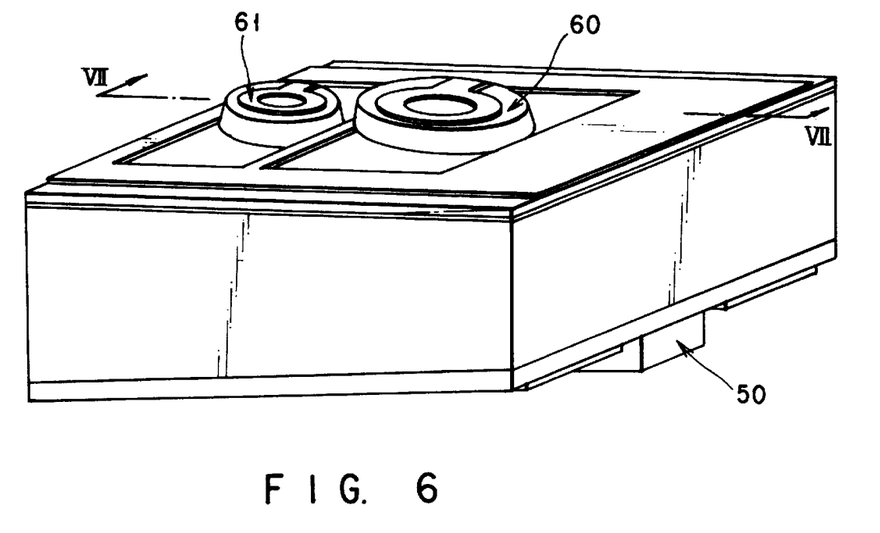
FIG. 6 shows an integrated device according to a first embodiment of the present invention.
Figure 7:
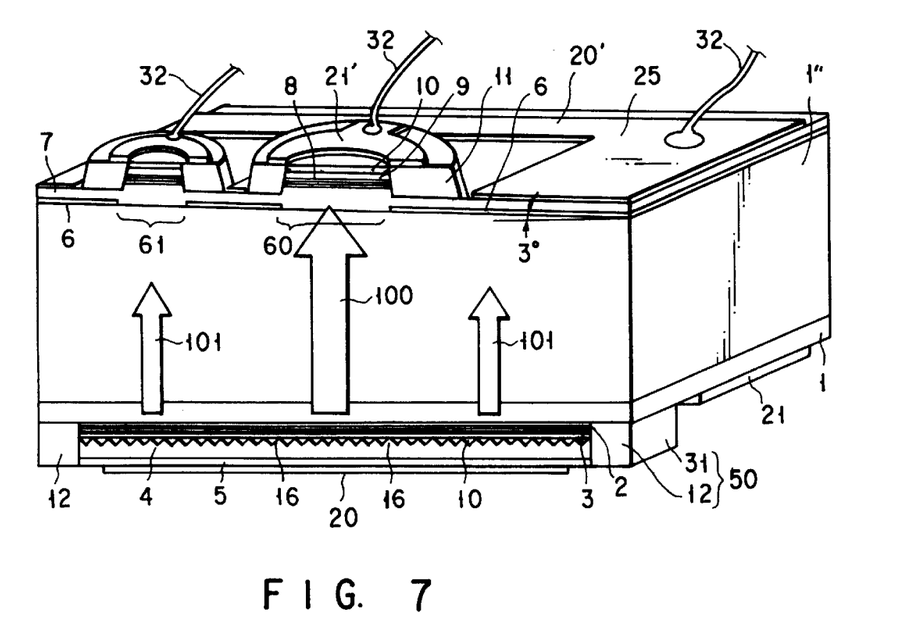
FIG. 7 is a cross-sectional view taken along line VII—VII in FIG. 6.

FIGS. 6 and 7 show a first embodiment of the integrated device comprising a light emitting element and an external modulator according to the present invention. FIG. 7 is a cross-sectional view taken along line VII—VII in FIG. 6.

An n-InP layer 1, an InGaAsP active layer 2 and an InGaAsP waveguide layer 3 are formed on a first major surface of a semi-insulating InP substrate 1". The InGaAsP waveguide layer 3 has a wider band gap than the InGaAsP active layer 2.

A second-order grating 10 is formed on the InGaAsP waveguide layer 3. The grating 10 is provided with two (3λ/8) phase-shift portions 16 and 16' between which a central portion of a resonator is located. The light intensity is highest in a region between the phase-shift portions 16 and 16'.

The active layer 2 may have an MQW (Multi-Quantum Well) layer structure, with which high performance is achieved by quantum effect, or a strained MQW layer structures. In the following description, active layers include those with such structures.

A p-InP layer 4 and a striped p-InGaAsP ohmic-contact layer 5 are formed on the grating 10. The ohmic-contact layer 5 and p-InP layer 4 are mesa-etched to constitute a GCL 50 of a ridge type waveguide structure.

In the GCL, one of radiation-mode beams emitted vertically upward and downward, which is radiated to the ridge 31 side, is not considered since it is absorbed by the ohmic layer 5 or scattered by the ridge structure.

Both end portions of the resonator of the GCL 50 are provided with anti-reflection (AR) coatings. Unless end-facet reflection of guided-mode light is prevented, a single longitudinal mode is not easily obtained or the phase-shift portions 16 and 16' are not effective.

Radiation from both end facets of the resonator of the GCL 50 is not necessary and is detrimental. In order to prevent radiation from both end facets, it is necessary to weaken the light intensity at both end facets.

The light intensity at both end facets can be weakened by dispensing with a diffraction grating near both end faces, creating an unpumped region near both end faces, or removing an active layer and creating a window structure comprising only the InP layer 12.

Electrodes will now be described.

An n-side electrode 21 is formed on the n-InP layer 1. The n-side electrode 21 is electrically isolated from a p-side electrode 20. The electrodes 20 and 21 are formed simultaneously with electrodes 20' and 21' of a modulator (described below) which is formed on a second major surface of the substrate 1" and serves also as a photodiode. The ridge stripes may be formed after the crystal growth on the second major surface of the substrate 1".

The second major surface of the semi-insulating substrate 1" is inclined by a few degrees (e.g. 3°) with respect to the first major surface of the semi-insulating substrate 1".

An InGaAs absorption layer 6 is formed on the second major surface of the semi-insulating substrate 1". An opening (window) is formed in the absorption layer 6 in a position corresponding to a region between the two (3λ/8) phase-shift portions 16 and 16' where the radiation-mode beam has a highest intensity. A radiation-mode beam 100 from the GCL 50 is made incident on an EA modulator 60 via the opening. The opening functions to prevent an excess radiation-mode beam from leaking out of the region other than the modulator.

A p-InP layer 7, an MQW structure 8 of a 100-layer, an n⁻-InP layer 9 and an n⁺-InP layer 10 are formed on the semi-insulating substrate 1". These layers 7 to 10 are formed in a cylindrical mesa shape. An SI (Semi-Insulating)-InP layer 11 is provided around the layers 7 to 10.

The annular n-electrode 21" is formed in contact with the n⁺-InP layer 10. The p-electrode 20' is formed on the p-InP layer 7. The EA modulator 60 is formed on the second major surface of the semi-insulating substrate 1". The modulator 60 controls the beam output from the GCL 50 so that is may be emitted to the outside or shut off.

Since the beam is output in a direction perpendicular to the surface of the wafer, it is possible to form a lens on the surface of the wafer by planar techniques. In other words, in the integrated device of the present invention, the integrated device can be easily combined with an optical fiber. Bonding wires 32 are connected to bonding pads provided on the electrodes 20' and 21'.

Figure 8:
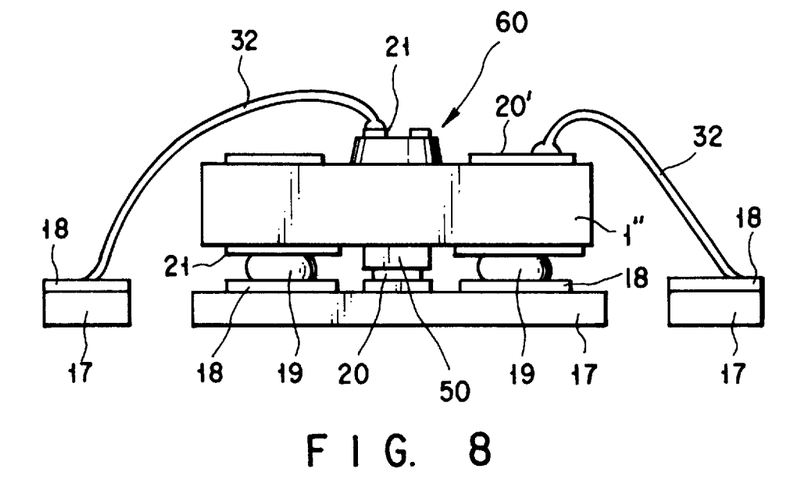
FIG. 8 shows the integrated device of FIG. 6 which is mounted on a board.

FIG. 8 schematically shows the integrated device shown in FIGS. 6 and 7, which is mounted on a printed circuit. In the present invention, the integrated device is flip-chip-mounted such that the GCL 50 which produces heat due to electric current is situated downward.

Specifically, the electrodes 20 and 21 of the integrated device are connected to wiring 18 on the printed circuit 17 by means of bumps 19. On the other hand, the electrodes 20' and 21" are connected to the wiring 18 by means of bonding wires 32.

In the above-described integrated device, if a reverse bias is applied to the EA modulator 60 in the transmission mode, the radiation-mode beam 100 is absorbed by the MQW layer 8 and is not emitted from the integrated device 100.

Radiation-mode beams 101 propagating through regions outside the phase-shift portions 16 and 16' of the GCL 50 are absorbed by a photodiode 61 and monitored. The photodiode 61 has the same structure as the EA modulator 60. If a predetermined reverse bias is applied to the EA modulator, the EA modulator functions as photodiode. By monitoring the radiation-mode beam 100, the intensity of the output beam 100 from the GCL 50 is controlled to be constant.

On the other hand, in the receiver mode, the GCL 50 is turned off and a predetermined reverse bias is applied to the EA modulator 60. As a result, the EA modulator 60 functions as photodiode and can detect an optical signal. In the present invention, the transmission unit and the reception unit can be formed of the integrated device of the same structure.

Figure 9:
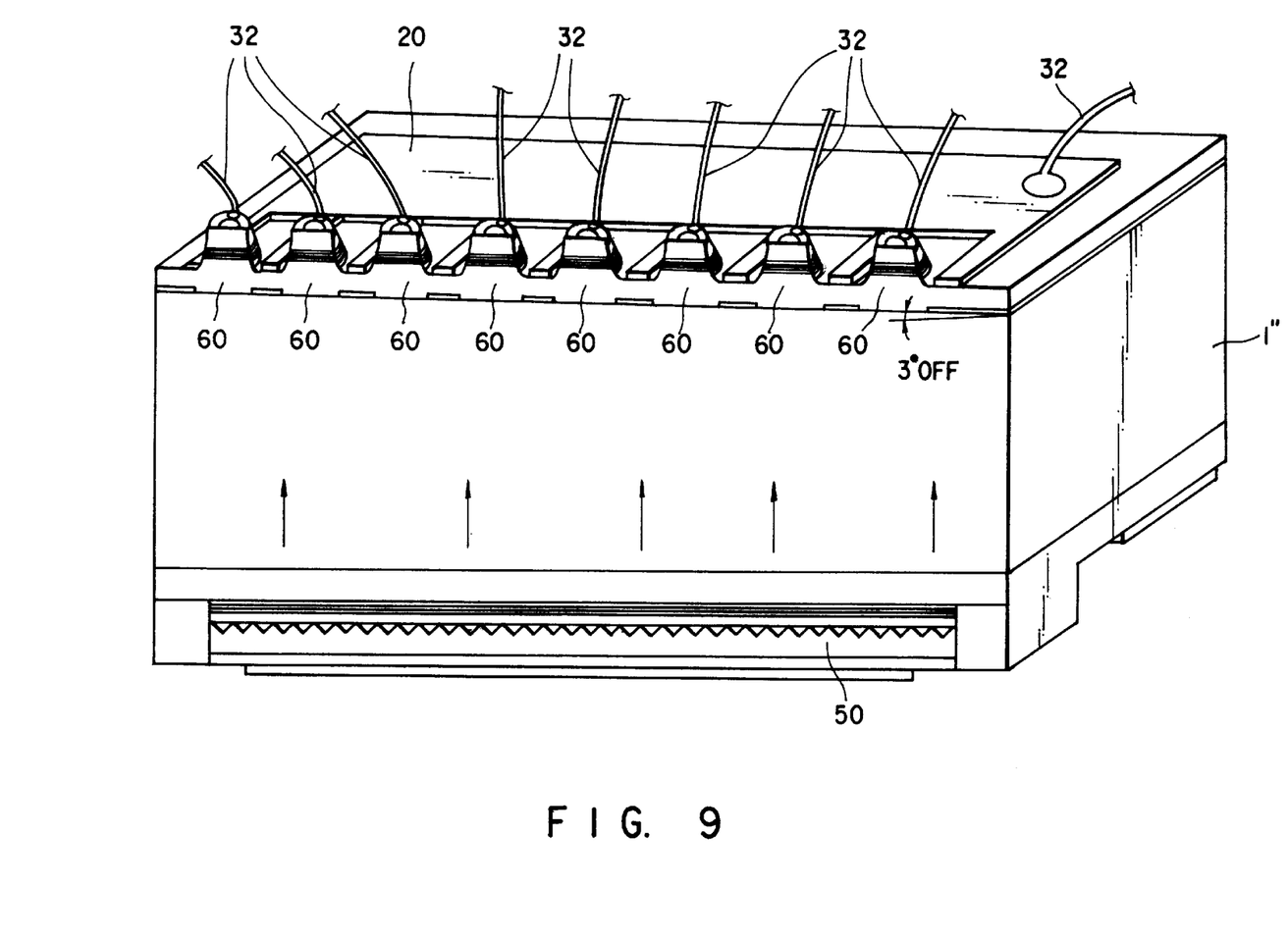
FIG. 9 shows an integrated device according to a second embodiment of the present invention.

FIG. 9 shows an integrated device of a light emitting element and an external modulator according to a second embodiment of the invention.

The integrated device of the second embodiment differs from that shown in FIGS. 6 and 7 in the following respects.

The radiation-mode beam from the GCL 50 has a uniform output distribution along the resonator direction. Linearly arranged EA modulators 60 are formed on the GCL 50. Each modulator 60 has a cylindrical mesa structure. One of the EA modulators 60 can be used as a monitoring photodiode.

In this embodiment, the radiation-mode beam of the GCL 50 has a uniform distribution in the longitudinal direction of the resonator. However, the output distribution of the radiation-mode beam in the longitudinal direction of the resonator may be varied by forming a phase-shift portion at a proper location of the grating.

Figure 10:
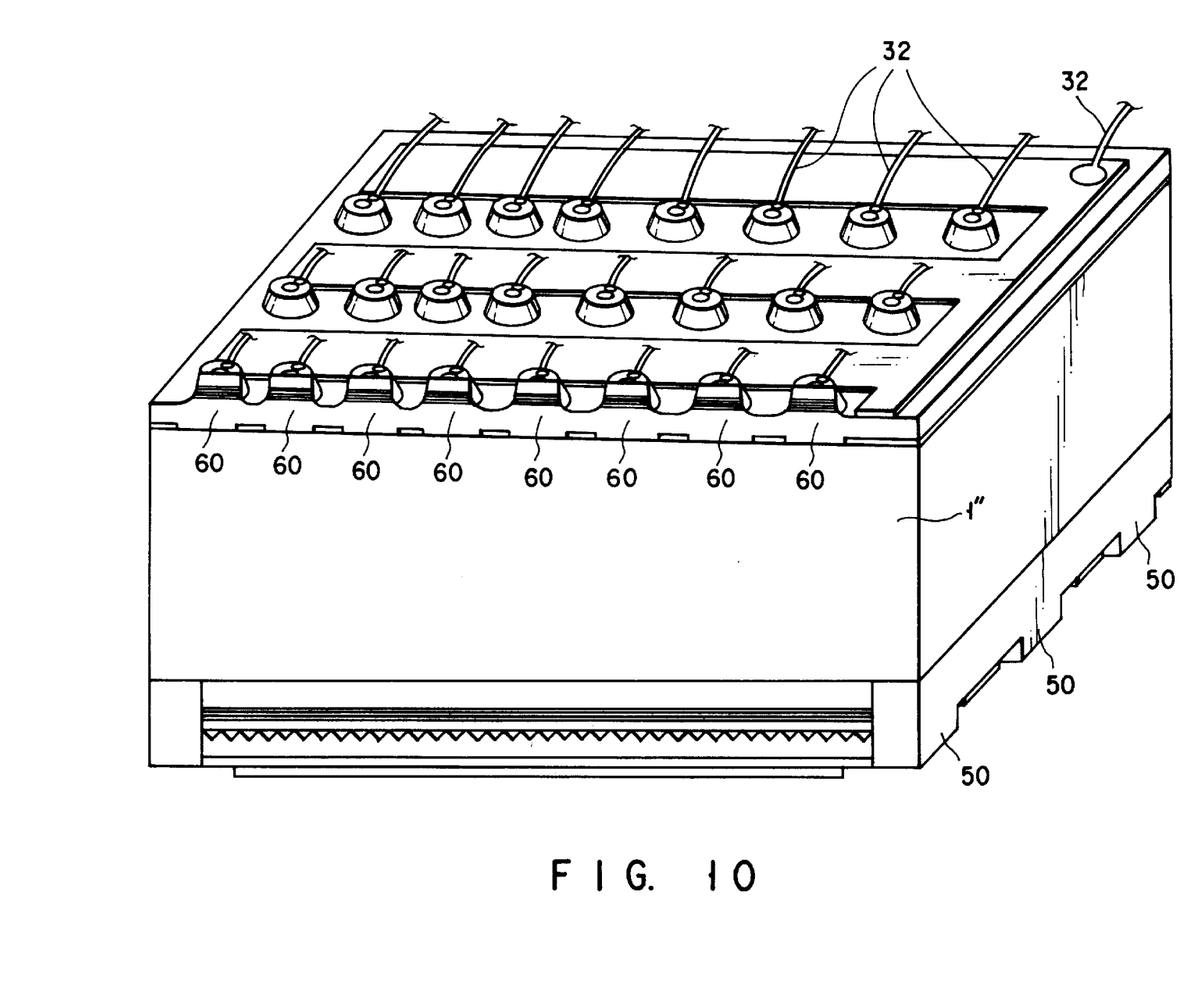
FIG. 10 shows an integrated device according to a third embodiment of the present invention.

FIG. 10 shows an integrated device of a light emitting element and an external modulator according to a third embodiment of the invention.

The integrated device of the second embodiment differs from that shown in FIGS. 6 and 7 in the following respects.

A plurality of GCLs 50 are formed on a first major surface of the semi-insulating substrate 1". The radiation-mode beam from each GCL 50 has a uniform output distribution along the resonator direction. Linearly arranged EA modulators 60 are formed on each GCL 50. Each modulator 60 has a cylindrical mesa structure. One of the EA modulators 60 can be used as a monitoring photodiode.

If the periods of diffraction gratings of the GCLs 50 are made to differ from one another, the radiation-mode beams output from the GCLs 50 have different oscillation wavelengths. Thus, the integrated device according to this embodiment can be used as a light source for multi-wavelength communication.

In the semiconductor devices shown in FIGS. 6 to 10, the first and second major surfaces of the semi-insulating substrate 1" are inclined to each other by several degrees (e.g. 3°) in the direction of the resonator of the GCL 50. By virtue of the inclination, a reflection beam does not return to the resonator of the GCL 50 since the beam divergence of the radiation-mode beam is a few degrees in the resonator (cavity) direction.

Since the reflection beam from the modulator or optical fiber does not return to the GCL 50, the operation of the integrated device is stabilized and chirp is reduced.

Figure 11:
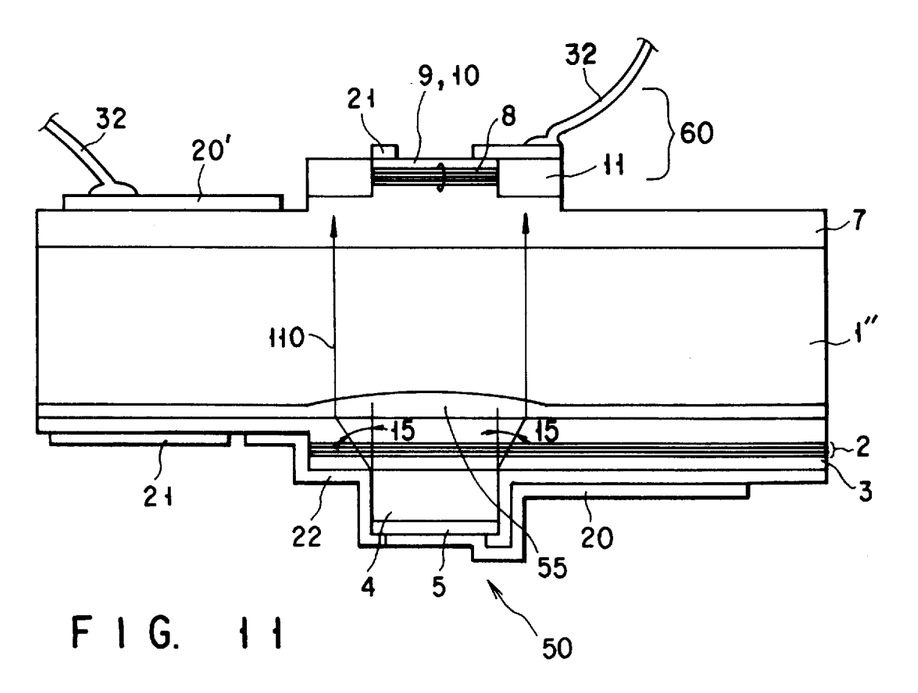
FIG. 11 shows an integrated device according to a fourth embodiment of the present invention.

FIG. 11 shows an integrated device of a light emitting element and an external modulator according to a fourth embodiment of the invention.

As has been described above, the beam divergence of the radiation-mode beam from the GCL 50 is a few degrees and very small in the longitudinal direction of the resonator. In the width direction of the waveguide, however, the beam divergence of radiation of the radiation-mode beam 110 is about 30° in terms of full width at half maximum. It is necessary, therefore, to efficiently converge the radiation-mode beam 110 on the modulator 60.

In this embodiment, for this purpose, a lens 55 is formed on the GCL (50)-side major surface of the substrate 1".

Specifically, a curved groove is formed in the GCL (50)-side major surface of the substrate 1. An InGaAsP layer is formed on the major surface of the substrate 1" so as to fill the groove. The InGaAsP layer has a greater refractive index than the substrate 1" and is transparent. Thus, the lens 55 is formed in the groove.

Figure 12:
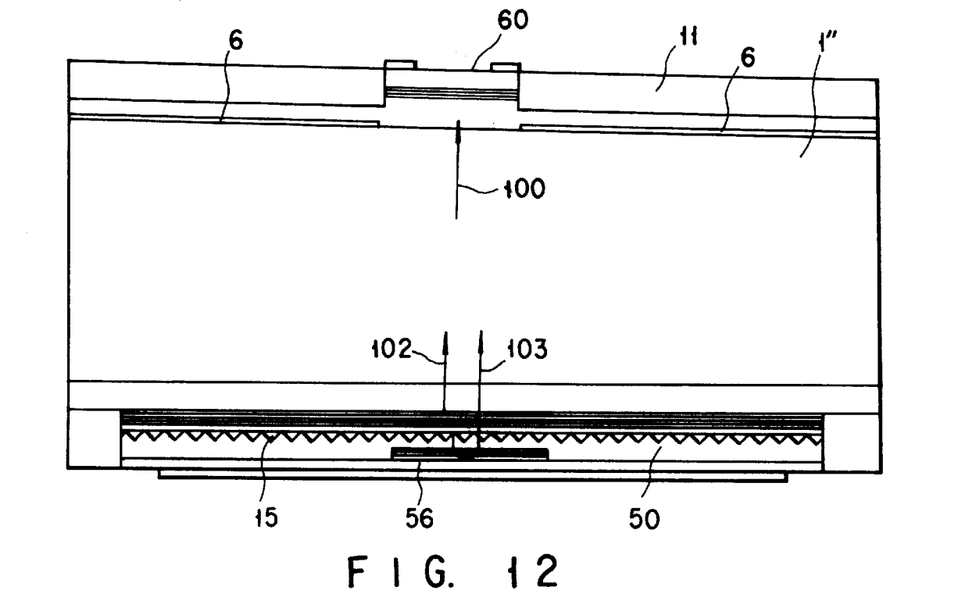
FIG. 12 shows an integrated device according to a fifth embodiment of the present invention.

FIG. 12 shows an integrated device of a light emitting element and an external modulator according to a fifth embodiment of the invention.

This embodiment does not adopt the means for causing optical interference by phase shift, thereby intensifying a radiation mode beam. Instead, a light beam radiated from a GCL 50 towards a substrate 1" is made to interfere with a light beam radiated from the GCL 50 towards a ridge (i.e. in a direction opposite to the substrate 1"), thereby intensifying the radiation mode beam.

Specifically, in the present embodiment, a reflection mirror 56 comprising a high-reflection multi-layer film is provided on the ridge side (p-side). A light component 103 propagating on the ridge side is reflected by the reflection mirror 56 and turned towards the substrate 1". Thus, the light component 102 output towards the substrate 1" and light component 103 reflected by the reflection mirror 56 interfere with each other.

In this case, the shape of the grating (diffraction grating) 15 and the position of the reflection mirror 56 are controlled so that the light components 102 and 103 interfere with and intensify constructively each other. As a result, the modulator 60 receives a radiation mode beam having a great light intensity and the intensity of the output beam from the integrated device increases.

Figure 13:
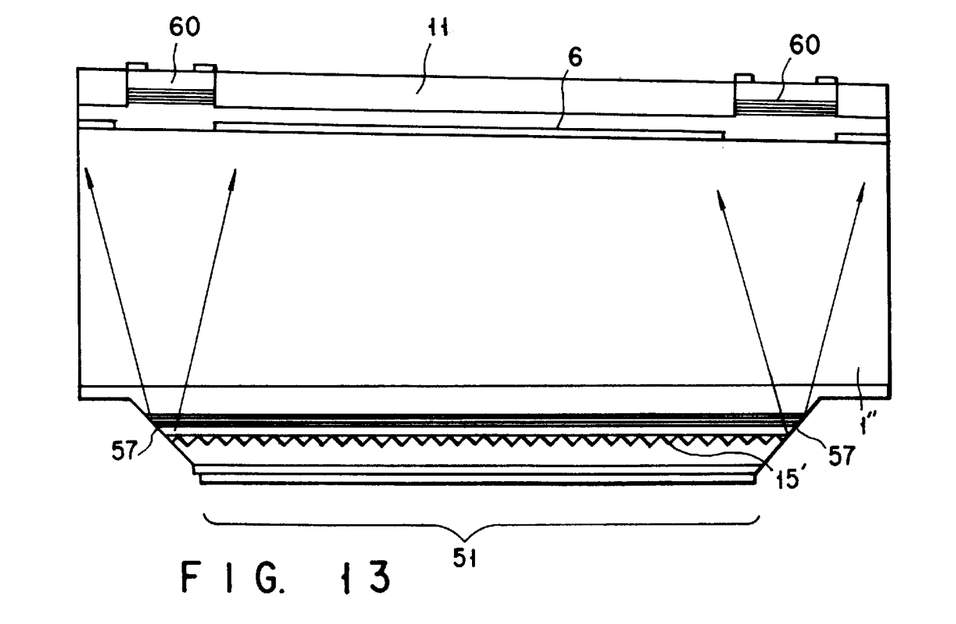
FIG. 13 shows an integrated device according to a sixth embodiment of the present invention.

FIG. 13 shows an integrated device of a light emitting element and an external modulator according to a sixth embodiment of the invention.

In this embodiment, the light emitting element is composed of not a GCL but an oblique reflection type DFB laser 51. A diffraction grating 15' is of the first order. Accordingly, no radiation mode beam is produced. Specifically, light is emitted from both end portions of a resonator in this light emitting element.

Oblique reflection mirrors 57 function to turn light beams output from both end portions of the resonator towards the modulators 60. In this case, the intensity of the output light is greater than the intensity of an output beam from a GCL.

If each reflection mirror 57 is formed of a concave mirror, a light beam of greater intensity can be guided to the modulator 60.

Figure 14:
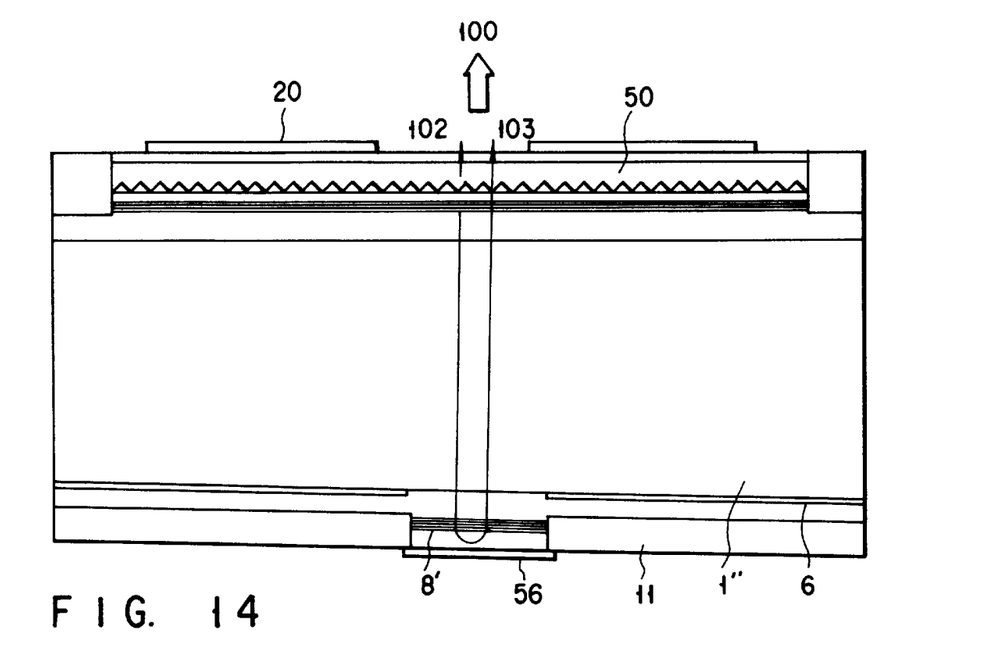
FIG. 14 shows an integrated device according to a seventh embodiment of the present invention.

FIG. 14 shows an integrated device of a light emitting element and an external modulator according to a seventh embodiment of the invention.

This integrated device is not provided with an EA modulator. Modulation is effected by a method different from that in the preceding embodiments. This integrated device is mounted with a reflection mirror 56 situated on the heat sink side.

A radiation mode beam 103 output from a GCL 50 towards the substrate 1" is reflected by a reflection mirror 56 and guided towards the GCL 50. The reflection beam 103 interferes with a radiation mode beam 102 emitted to the outside from the GCL 50.

Modulation can be effected by varying the refractive index of an MQW layer 8' formed adjacent to the reflection mirror 56. Accordingly, the intensity of the output beam is increased by such interference as to intensity the radiation mode beams 102 and 103 and can be decreased by such interference as to weaken the radiation mode beams 102 and 103.

Figure 15:
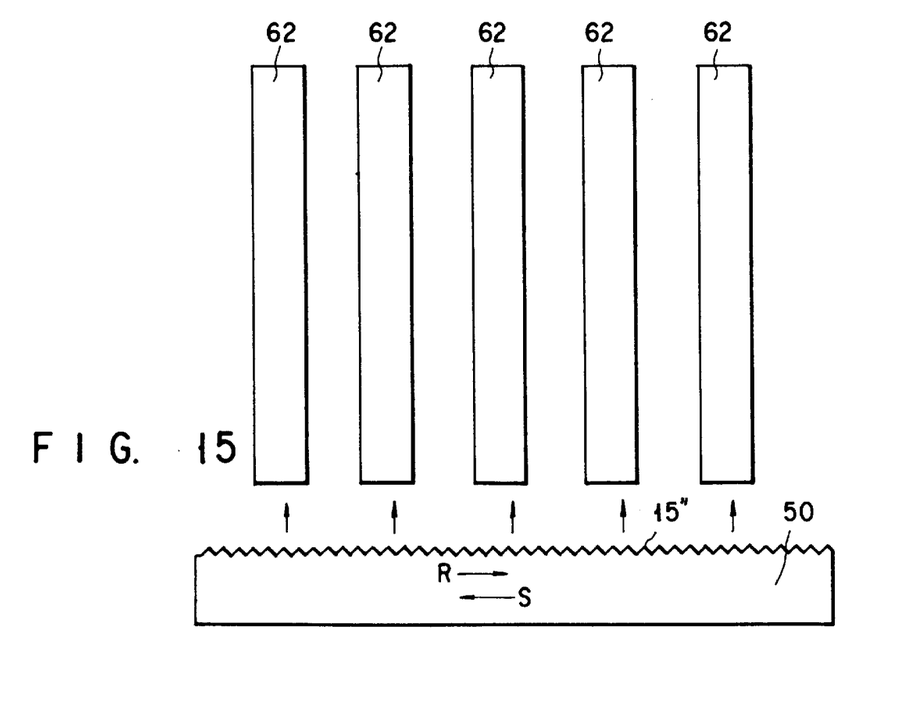
FIG. 15 shows an integrated device according to an eighth embodiment of the present invention.

FIG. 15 shows an integrated device of a light emitting element and an external modulator according to an eighth embodiment of the invention.

In this integrated device, a DFB laser 50 and waveguide type EA modulators 62 are formed in the same plane. The DFB laser 50 has a second-order diffraction grating 15" at an end portion of a buried type waveguide. An advantage in this method resides in that a number of waveguide type EA modulators 62 can be provided in relation to one DFB laser.

Figure 16:
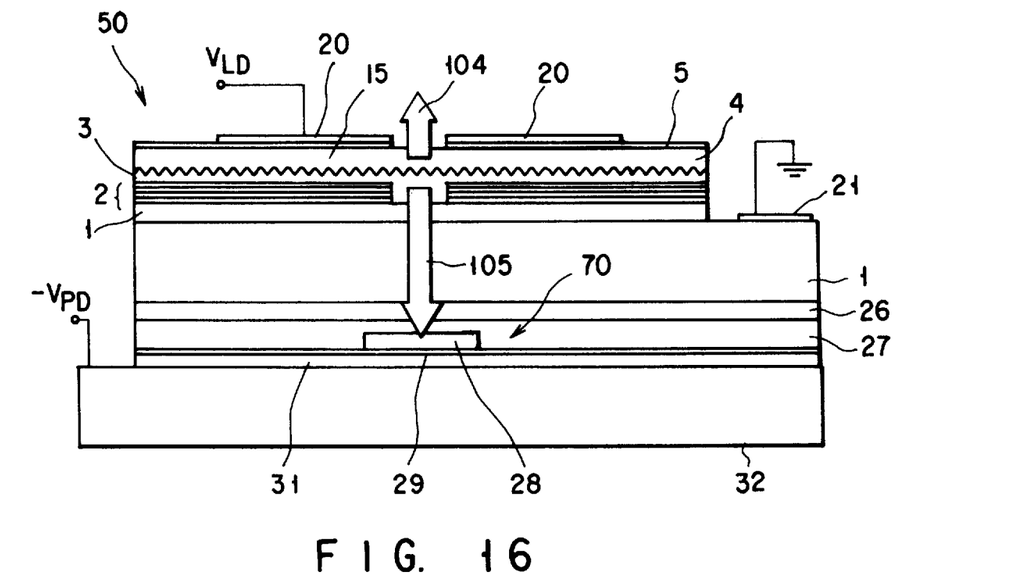
FIG. 16 shows an integrated device according to a ninth embodiment of the present invention.

FIG. 16 shows an integrated device of a light emitting element and an external modulator according to a ninth embodiment of the invention.

An optical communication system needs to have a light emitting element for transmitting an optical signal, a light receiving element for receiving an optical signal, and a light receiving element for monitoring the intensity of an optical signal output from the light emitting element.

If these elements are monolithically formed, the transmitter unit and receiver unit can be made to have the same structure and the manufacturing cost of the optical communication system can be reduced.

In this embodiment, in consideration of the above circumstances, there is provided an integrated device in which a surface-type light emitting element such as a GCL and a light receiving element such as a photodiode are monolithically formed.

A GCL 50 is formed on one major surface of an n-type InP substrate 1'.

Specifically, an n-type InP layer 1 and an InGaAsP active layer 2 are formed on said one major surface of the n-type InP substrate 1'. An opening is formed in a central portion of the InGaAsP active layer 2. The active layer 2 may be replaced with an active layer having an MQW (Multi-quantum well) structure capable of enhancing the device performance by virtue of quantum effect or a strained MQW structure.

An InGaAsP waveguide layer 3 is formed on the InGaAsP active layer 2 so as to completely fill the opening. The band gap of the InGaAsP waveguide layer 3 is greater than that of the InGaAsP active layer 2. A second-order grating 15 is formed on the upper surface of the InGaAsP waveguide layer 3.

A p-type InP layer 4 and a p-type InGaAsP ohmic-contact layer 5 are formed on the grating 15 of the InGaAsP waveguide layer 3.

The n-type InP layer 1, InGaAsP active layer 2, InGaAsP waveguide layer 3, p-type InP layer 4 and p-type InGaAsP ohmic-contact layer 5 are formed in stripes (e.g. ridges) extending in the longitudinal direction of the waveguide layer.

A p-side electrode 20 of the GCL 50 is formed on the p-type InGaAsP ohmic contact layer 5. An n-side electrode 21 of the GCL 50 is formed on the n-type InP substrate 1".

On the other hand, a PIN photodiode 70 is formed on the other major surface of the n-type InP substrate 1'.

Specifically, an n-type InP layer 26 and n⁻-type InGaAsP layer 27 are formed on said other major surface of the n-type InP substrate 1'. A p-type InGaAsP layer 28 is formed in the n⁻-type InGaAsP layer 27 in a position corresponding to the opening in the active layer 2. The p-type InGaAsP layer 28 can be formed by diffusing p-type impurities (e.g. Zn) in the n⁻-type InGaAsP layer 27. A p-side electrode 29 of the photodiode 70 is formed on the p-type InGaAsP layer 28. The n-side electrode 21 of the GCL 50 functions also as n-side electrode of the photodiode 70.

The integrated device having the above structure is mounted on a heat sink 32 by means of solder 31, with the photodiode 70 facing the heat sink 32.

The photodiode 70 can be used for monitoring, if a potential $V_{LD}$ is applied to the electrode 20, a ground potential is applied to the electrode 21, a potential $-V_{PD}$ is applied to the electrode 29, a forward bias is applied to the GCL 50 and a reverse bias is applied to the photodiode 70. On the other hand, when the operation of the GCL 50 is stopped, the photodiode 70 can be used as light receiving element for receiving optical signals.

The photodiode 70 according to this embodiment can be used both for monitoring and receiving optical signals. Accordingly, the integrated device of this embodiment can be used both as an optical signal transmission device and an optical signal receiving device.

The refractive index of the opening portion (InGaAsP) of the active layer 2 is lower than that of the surrounding portion thereof. Thus, the wavelength of a radiation mode beam 105 passing through the opening portion is shifted by $\lambda/4$ and the coupling coefficient of the GCL 50 is set at about 3. In this case, the radiation mode beam output from the GCL 50 has a highest intensity at the opening portion of the active layer 2.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An integrated device comprising:
    at least one light emitting element, said light emitting element including a second-order or higher grating from which light is emitted; and
    at least one modulator facing toward a light emitting plane of said light emitting element.

2. The integrated device according to claim 1, wherein said light emitting element is provided on a first major plane of a transparent semiconductor substrate, and said modulator is provided on a second major plane.

3. The integrated device according to claim 1, wherein at least one phase shift in said grating or at least one region producing phase-shifting effect to said grating is provided for controlling the output intensity profile along said light emitting element.

4. The integrated device according to claim 1, wherein said light emitting element includes a waveguide, and both end portions of the waveguide are provided with low reflective regions or anti-reflection coatings.

5. The integrated device according to claim 1, wherein said at least one modulator has a cylindrical mesa shape.

6. The integrated device according to claim 1, wherein said at least one modulator includes an element having variable absorption properties due to application of an electric field.

7. The integrated device according to claim 1, wherein said at least one modulator includes a light receiving element for monitoring an optical signal output from said light emitting element or for detecting light input from external light sources.

8. The integrated device according to claim 7, wherein said light receiving element is a PIN photodiode.

9. The integrated device according to claim 7, wherein said light emitting element includes an active layer having a window portion which does not contain said active layer, and said light receiving element is formed in a position facing said window portion.

10. The integrated device according to claim 7, wherein the intensity of light is highest in a region where said light receiving element is situated.

11. The integrated device according to claim 7, wherein said light emitting element and said light receiving element are electrically connected to each other.

12. The integrated device according to claim 7, wherein said light emitting element includes an active layer having a multi-quantum well (MQW) structure or a strained MQW structure.

13. The integrated device according to claim 1, further comprising:

a layer for shutting out light output from said light emitting element to a region other than a region where said at least one modulator is situated.

14. The integrated device according to claim 1, wherein the intensity of light is highest in a region where said at least one modulator is situated.

15. The integrated device according to claim 1, further comprising:

a lens for decreasing an angle of broadening of the light output from said light emitting element, said lens being situated between said light emitting element and said at least one modulator.

16. The integrated device according to claim 1, wherein said light emitting element and said at least one modulator are electrically isolated from each other.

17. The integrated device according to claim 1, wherein said light emitting element emits first and second radiation mode beams, a first beam toward said modulator and a second beam in a direction opposite to the first beam, and wherein said second beam is reflected toward said modulator by a reflective mirror provided in the side opposite to said modulator.

18. The integrated device according to claim 1, wherein said light emitting element emits first and second radiation mode beams in opposite directions, a first beam being reflected in the same direction as a second beam by a reflective mirror, and wherein said reflective mirror functions as a modulator by varying the reflective phase of said reflective mirror.

19. The integrated device according to claim 1, wherein said light emitting element includes an active layer having a multi-quantum well (MQW) structure or a strained MQW structure.

20. The integrated device according to claim 1, wherein said at least one modulator has a multi-quantum well (MQW) structure.

21. The integrated device according to claim 1, further comprising:

external circuits connected to said modulator and said light emitting element; and a heat sink on which said integrated device is mounted.

22. The integrated device according to claim 1, wherein said second order grating is provided along at least one side of a waveguide structure of said light emitting element, and said modulator includes another waveguide structure of which direction is normal to said waveguide structure of said light emitting element, provided on the same crystal plane as said light emitting element.

* * * * *